US008858030B2

(12) United States Patent
Avramescu et al.

(10) Patent No.: US 8,858,030 B2
(45) Date of Patent: Oct. 14, 2014

(54) LASER LIGHT SOURCE

(75) Inventors: Adrian Avramescu, Regensburg (DE);
Alfred Lell, Maxhuette-Haidhof (DE);
Soenke Tautz, Tegernheim (DE);
Andreas Breidenassel, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 147 days.

(21) Appl. No.: 13/641,652

(22) PCT Filed: Apr. 6, 2011

(86) PCT No.: PCT/EP2011/055320
§ 371 (c)(1),
(2), (4) Date: Jan. 15, 2013

(87) PCT Pub. No.: WO2011/128233
PCT Pub. Date: Oct. 20, 2011

(65) Prior Publication Data
US 2013/0107534 A1 May 2, 2013

(30) Foreign Application Priority Data

Apr. 16, 2010 (DE) .......................... 10 2010 015 197

(51) Int. Cl.
*F21V 9/00* (2006.01)
*H01S 5/00* (2006.01)
*H01S 5/028* (2006.01)
*H01S 5/026* (2006.01)
*H01S 5/024* (2006.01)
*H01S 5/20* (2006.01)
*H01S 5/10* (2006.01)
*H01S 5/0683* (2006.01)
*H01S 5/022* (2006.01)
*H01S 5/22* (2006.01)

(52) U.S. Cl.
CPC ........... *H01S 5/0078* (2013.01); *H01S 5/02476* (2013.01); *H01S 5/2022* (2013.01); *H01S 5/1085* (2013.01); *H01S 5/0286* (2013.01); *H01S 5/0683* (2013.01); *H01S 5/02461* (2013.01); *H01S 5/02252* (2013.01); *H01S 2301/18* (2013.01); *H01S 5/22* (2013.01); *H01S 5/02212* (2013.01); *H01S 5/0264* (2013.01)
USPC ........................... 362/259; 362/293; 362/231

(58) Field of Classification Search
USPC ........................................ 362/259, 293, 800
See application file for complete search history.

(56) References Cited

U.S. PATENT DOCUMENTS 3,740,661 A  6/1973  D'Asaro
4,840,922 A  6/1989  Kobayashi et al.

(Continued)

FOREIGN PATENT DOCUMENTS

DE  10 2008 013 896 A1  6/2009
DE  10 2008 012 859 A1  11/2009

(Continued)

OTHER PUBLICATIONS

Laino, V., et al., "Substrate Modes of (Al,In) GaN Semiconductor Laser Diodes on SiC and GaN Substrates," IEEE Journal of Quantum Electronics, vol. 43, No. 1, Jan. 2007, pp. 16-24.

*Primary Examiner* — Ali Alavi
(74) *Attorney, Agent, or Firm* — Slater & Matsil, L.L.P.

(57) ABSTRACT

A laser light source for emitting coherent electromagnetic radiation has a vertical far-field radiation profile, having a series of semiconductor layers for generating the coherent electromagnetic radiation. An active region is located on a substrate. The coherent electromagnetic radiation is emitted during operation in an emission direction at least from a main emission region of a radiation output surface, and the radiation output surface is formed by a side surface of the sequence of semiconductor layers. A filter element suppresses coherent electromagnetic radiation in the vertical far-field radiation profile. The radiation was generated during operation and emitted by an auxiliary emission region of the radiation output surface. The auxiliary emission region is vertically offset from and spatially separated from the main emission region.

19 Claims, 11 Drawing Sheets

(56) References Cited

U.S. PATENT DOCUMENTS

| | | |
|---|---|---|
| 7,103,082 B2 | 9/2006 | Sugimoto et al. |
| 7,972,034 B2 * | 7/2011 | Takagi ............... 362/259 |
| 2002/0100914 A1 | 8/2002 | Yoshida |
| 2003/0063643 A1 | 4/2003 | Yoshida et al. |
| 2005/0269584 A1 | 12/2005 | Hasegawa et al. |
| 2007/0278475 A1 * | 12/2007 | Koda et al. ............ 257/13 |
| 2008/0101422 A1 | 5/2008 | Ryu et al. |
| 2008/0102546 A1 | 5/2008 | Ryu et al. |
| 2009/0028204 A1 | 1/2009 | Hiroyama et al. |
| 2009/0219967 A1 | 9/2009 | Hashimoto |
| 2010/0008392 A1 | 1/2010 | Hashimoto |
| 2010/0232466 A1 | 9/2010 | Ichinokura et al. |
| 2010/0295065 A1 | 11/2010 | Nakayama |
| 2011/0051766 A1 | 3/2011 | Reill et al. |
| 2011/0188530 A1 * | 8/2011 | Lell et al. ............ 372/49.01 |
| 2013/0148683 A1 * | 6/2013 | Lell et al. ............ 372/49.01 |

FOREIGN PATENT DOCUMENTS

| | | |
|---|---|---|
| JP | 01-096979 A | 4/1989 |
| JP | 11-068256 A | 3/1999 |
| JP | 11-224969 A | 8/1999 |
| JP | 2001-148545 A | 5/2001 |
| JP | 2002-280663 A | 9/2002 |
| JP | 2005-101457 A | 4/2005 |
| WO | WO 2009/080012 A1 | 7/2009 |

* cited by examiner

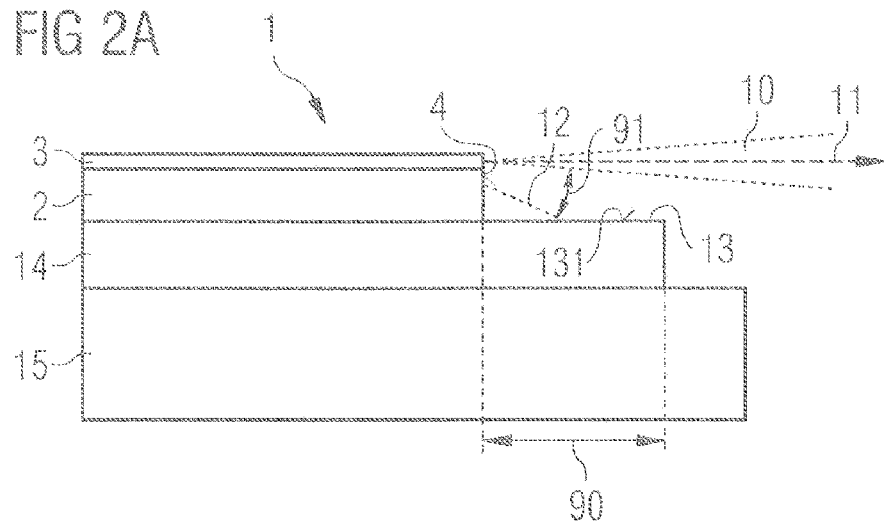
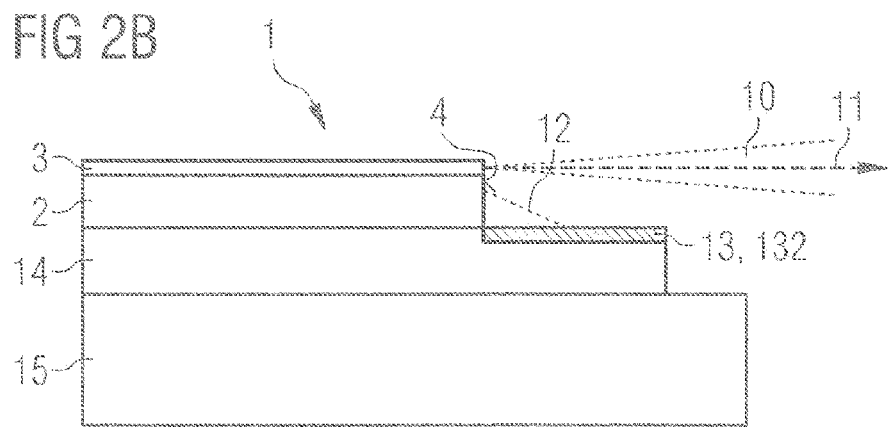
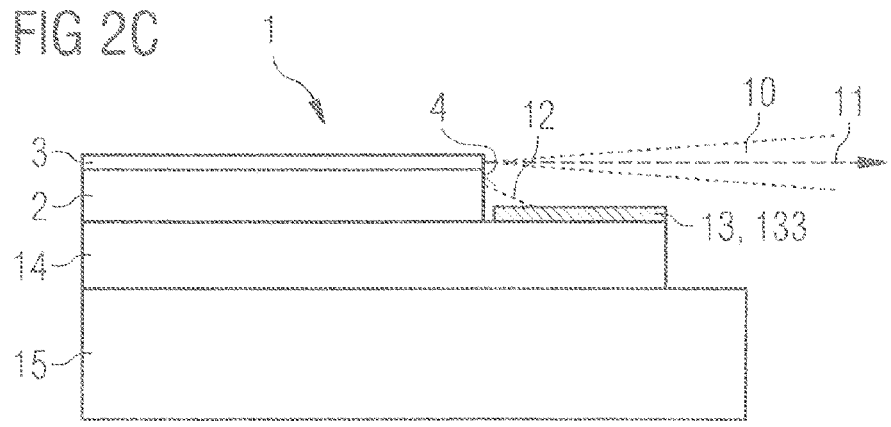

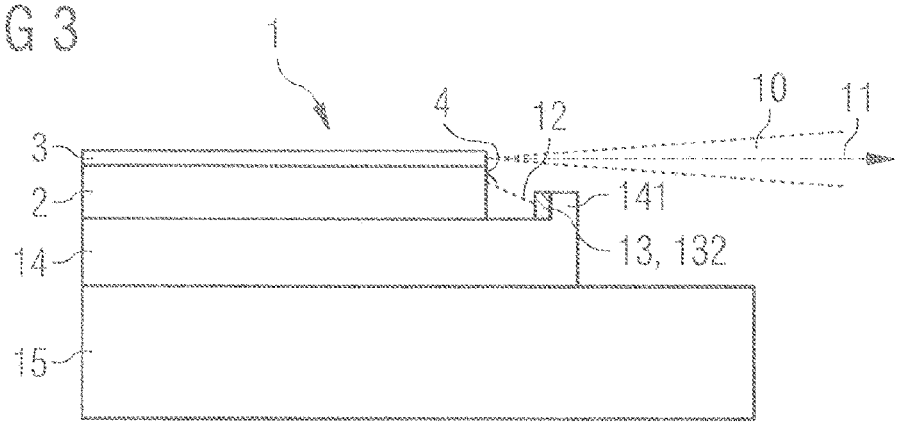
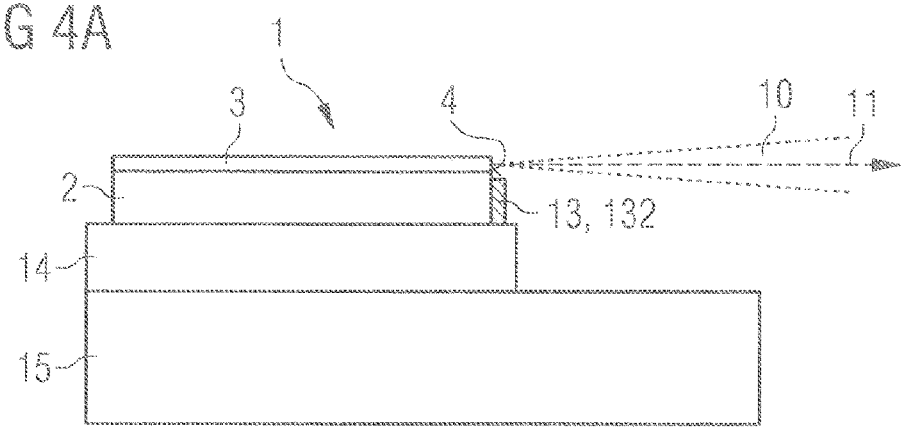
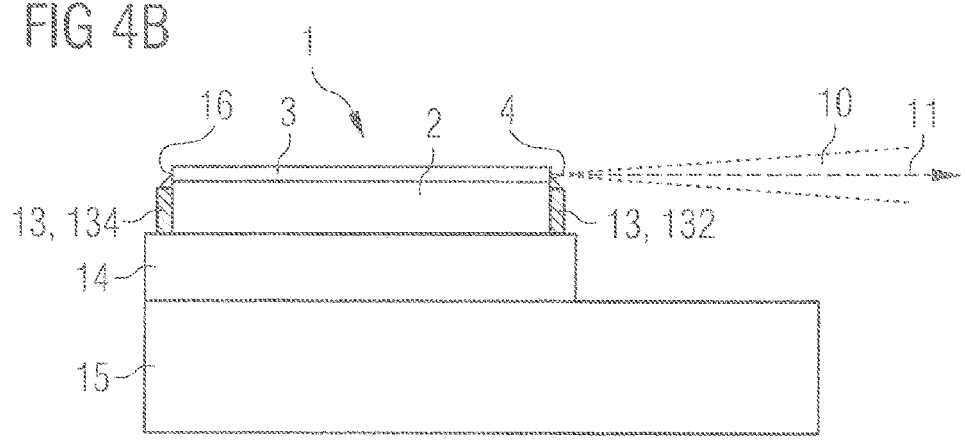

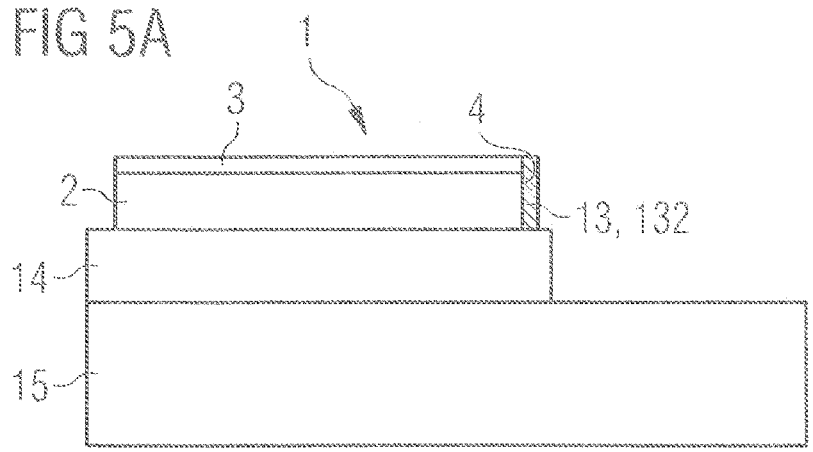
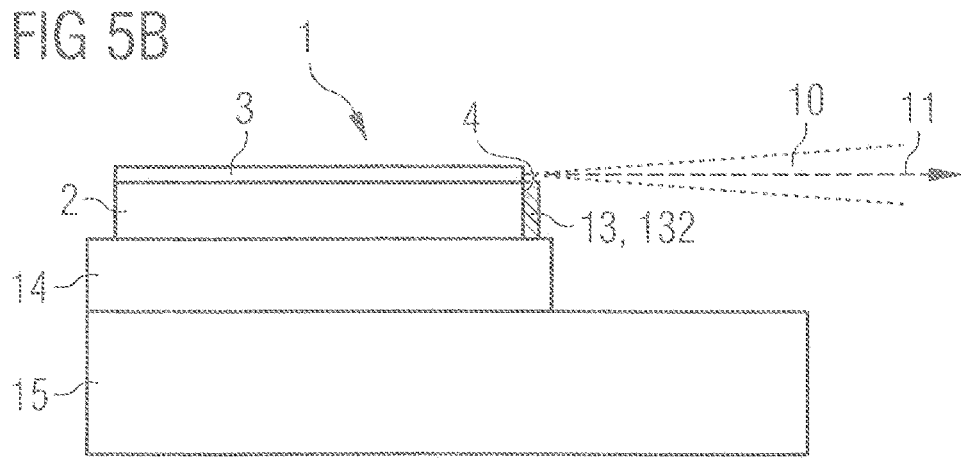

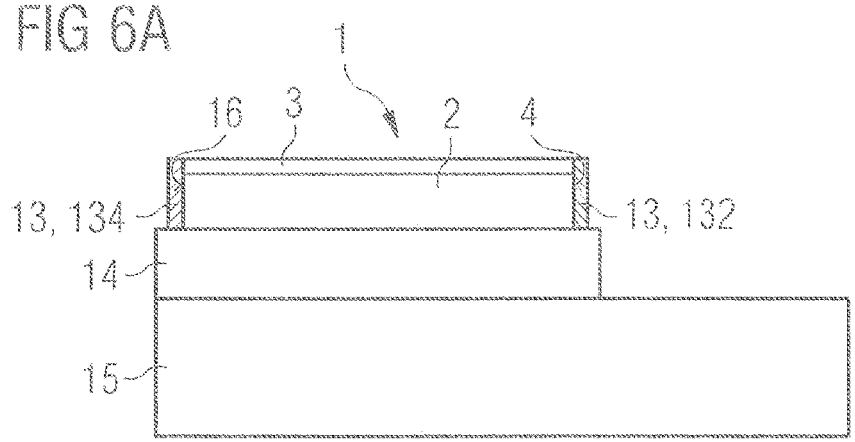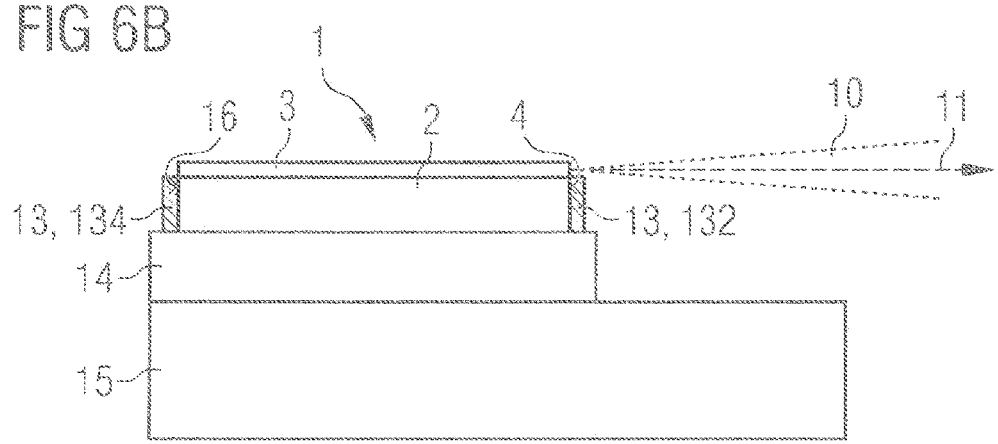

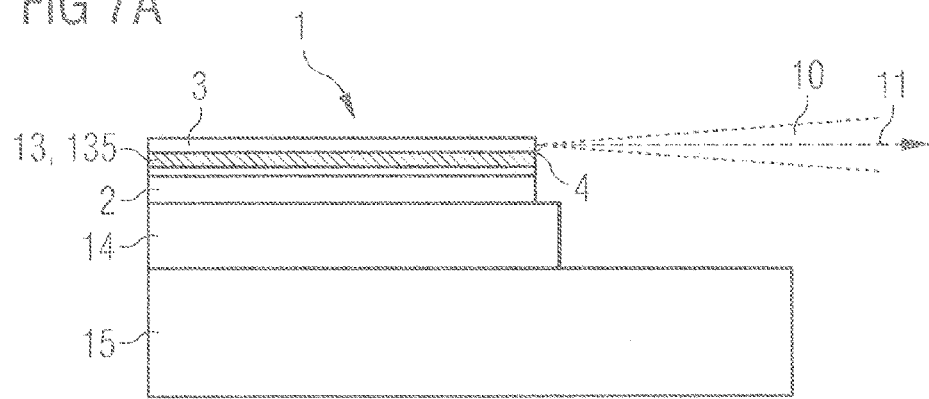
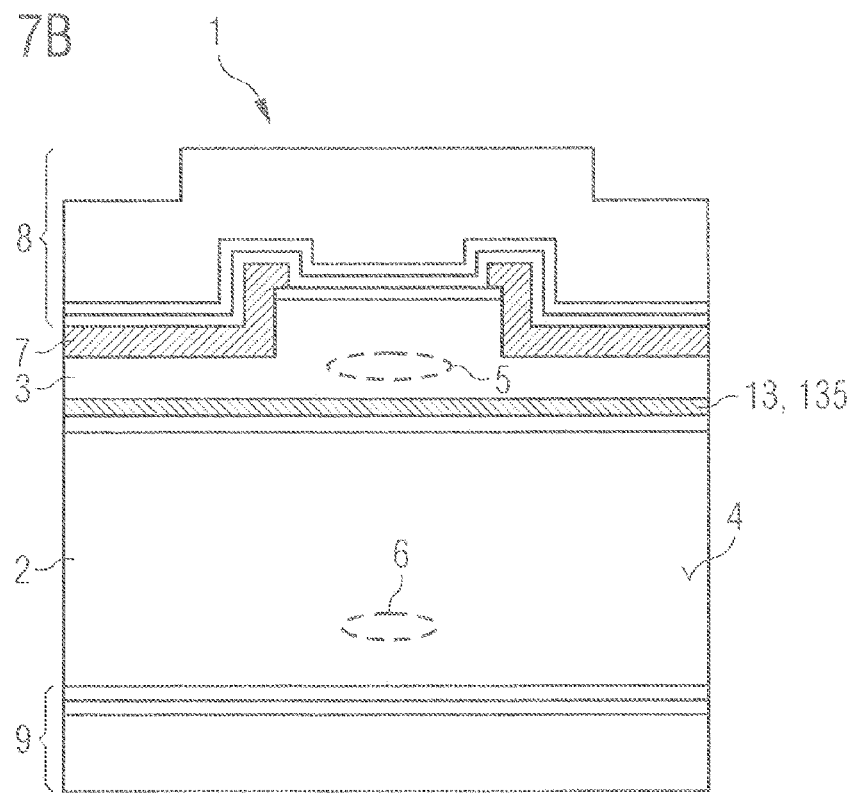

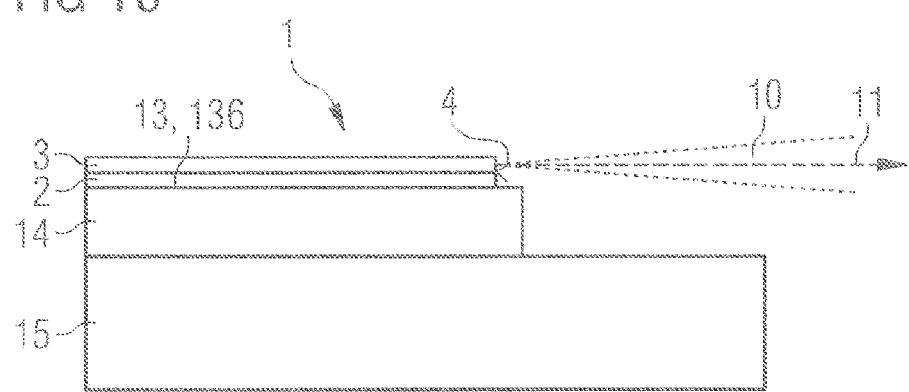

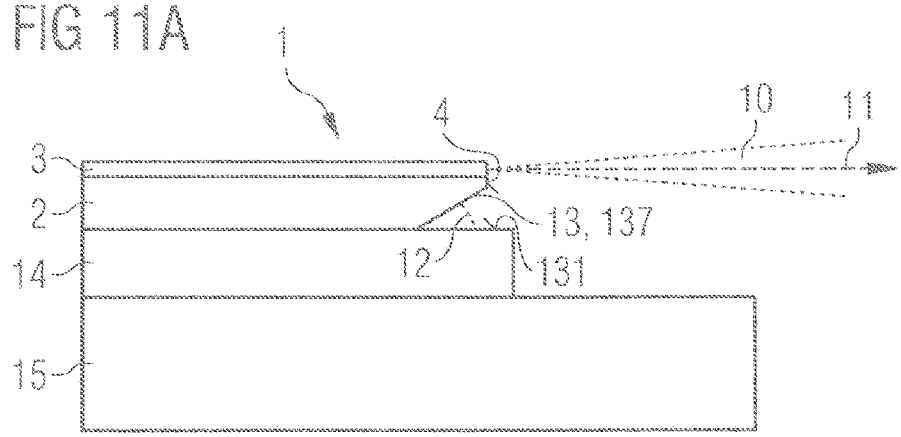
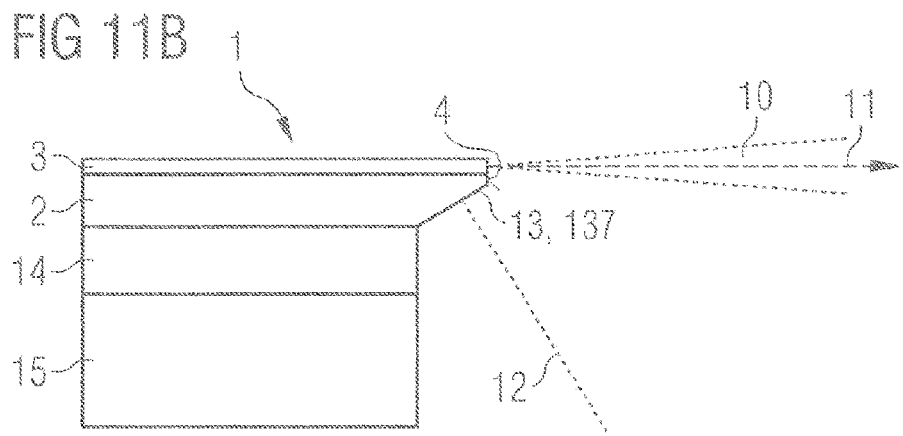
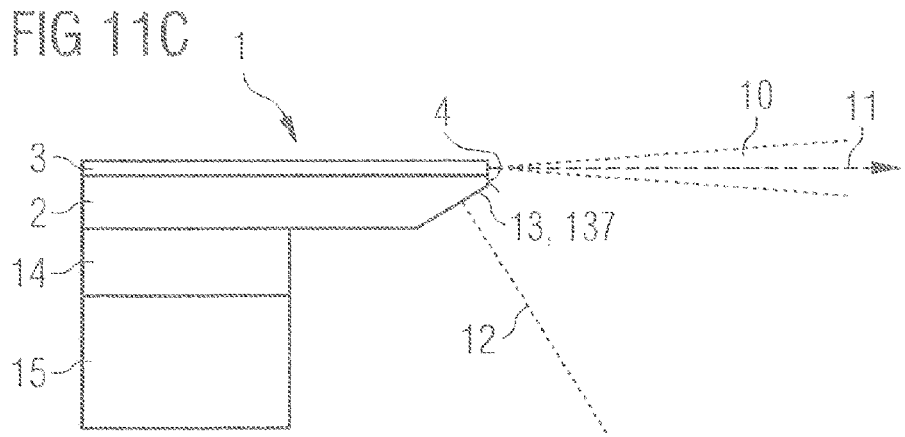

LASER LIGHT SOURCE

This patent application is a national phase filing under section 371 of PCT/EP2011/055320, filed Apr. 6, 2011, which claims the priority of German patent application 10 2010 015 197.1, filed Apr. 16, 2010, each of which is incorporated herein by reference in its entirety.

TECHNICAL FIELD

A laser light source is specified.

BACKGROUND

In many areas of application, heightened requirements are made of the beam quality of a laser diode. One example of such areas of application with heightened requirements is projection applications, for example. Since, in such applications, a laser beam is usually radiated onto a viewing screen that is sometimes far away, the quality of the far-field of the laser beam determines the quality of the projection application and thus of the image as perceived by a viewer. In this case, the quality of the far-field beam profile governs, in particular, the focusability and collimatability of the laser beam, for which reason monomode laser diodes having a Gaussian beam profile are preferably used. Deviations of the far-field beam profile from the Gaussian beam profile lead to restricted focusability and collimatability.

Conventional production of laser diodes typically yields a proportion of diodes which, although they fulfill all performance criteria, nevertheless exhibit disturbances in the vertical far-field. These disturbances can be manifested for example in the vertical far-field beam profile by intensity maxima which occur alongside the main emission cone in a specific angular range. On account of the above-described disadvantages of such non-Gaussian far-field beam profiles, devices of this type are usually rejected.

Although less highly pronounced disturbances of the vertical far-field beam profile do not necessarily lead to the rejection of the laser diodes, they may nevertheless lead to certain losses in the imaging properties. Such more or less highly pronounced disturbances in the vertical far-field beam profile are present in known laser diodes since the customary epitaxial design nowadays does not define the fast-axis far-field beam profile, that is to say the vertical far-field beam profile in the case of edge emitting laser diodes, sufficiently for achieving the desired Gaussian far-field beam profile in all devices.

Besides the already mentioned device selection from a 100% measurement of the far-field, which, although used successfully, at the same time increases the production costs as a result of the decrease in yield caused by rejection, or the acceptance of disturbances in the far-field which lead to losses in the projection imaging, lateral chip structures for far-field improvement are also known, thus for instance from U.S. Pat. No. 7,103,082 B2, but they cannot be applied to the vertical far-field.

In solid-state lasers or systems, so-called mode stops can also contribute to far-field improvement. However, they are very complex in terms of alignment and cannot be used for improving the vertical far-field beam profile of semiconductor lasers such as, for instance, nitride-based diode lasers.

SUMMARY OF THE INVENTION

One object of at least one embodiment is to specify a laser light source comprising a semiconductor layer sequence for emitting coherent electromagnetic radiation having a vertical far-field beam profile.

This object is achieved by means of an article comprising the features of the independent patent claim. Advantageous embodiments and developments of the article are characterized in the dependent claims and are evident from the following description and the drawings.

In accordance with at least one embodiment, a laser light source for emitting coherent electromagnetic radiation having a vertical far-field beam profile comprises, in particular, a semiconductor layer sequence for generating the coherent electromagnetic radiation with an active region on a substrate, wherein the coherent electromagnetic radiation is emitted during operation at least from a main emission region of a radiation coupling-out area with an emission direction and the radiation coupling-out area is formed by a side area of the semiconductor layer sequence. Furthermore, the laser light source comprises a filter element, which suppresses coherent electromagnetic radiation in the vertical far-field beam profile, said radiation being generated during operation and emitted from an auxiliary emission region of the radiation coupling-out area, said auxiliary emission region being vertically offset and spatially separated with respect to the main emission region.

Here and hereinafter the coherent electromagnetic radiation emitted from the main emission region is also designated as main emission, while the coherent electromagnetic radiation emitted from the auxiliary emission region is also designated as auxiliary emission.

Suppression of the coherent electromagnetic radiation emitted from the auxiliary emission region of the radiation coupling-out area can mean, in particular, that the disturbances brought about by the auxiliary emission in the vertical far-field beam profile, for example in the form of one or more auxiliary peaks with respect to the main peak of the main emission, are avoided or eliminated. Consequently, it is advantageously possible to utilize laser light sources comprising a semiconductor layer sequence which indeed possibly have an auxiliary emission in addition to the main emission, but in which the auxiliary emission is suppressed by the filter element in such a way that for projection imagings, for example, the desired beam properties, in particular the desired vertical far-field beam profile, are achieved.

As is described further below, the semiconductor layer sequence can be embodied as an epitaxially grown layer sequence. Here and hereinafter the growth direction of the layers of the semiconductor layer sequence, determined by the epitaxy, is also designated as the vertical direction or as vertical. In particular, the vertical direction can correspond to the "fast axis" (known to the person skilled in the art) of the emitted coherent electromagnetic radiation. In this case, the vertical far-field beam profile designates the far-field beam profile which the coherent electromagnetic radiation has in the vertical direction.

The coherent electromagnetic radiation emitted from the main emission region of the radiation coupling-out area during operation has an emission cone whose axis corresponds to the emission direction.

In the case of the laser light source described here, notwithstanding a possible auxiliary emission, a higher proportion of devices produced can be usable, wherein the far-field of the laser light source described here can be significantly improved in comparison with known laser diodes and, for example, is Gaussian in particular in the vertical direction. An improved imaging quality can thereby be achieved for example in projection applications. Furthermore, in the case of the laser light source described here, only low additional costs are incurred owing to the filter element, and the complex alignment of additional optical components can be entirely obviated.

The semiconductor layer sequence can be embodied as an epitaxial layer sequence or as a radiation-emitting semiconductor chip comprising an epitaxial layer sequence, that is to say as an epitaxially grown semiconductor layer sequence. The epitaxial growth of the semiconductor layer sequence results in a growth direction, such that the semiconductor layer sequence has an underside and a top side which are oriented perpendicularly to the growth direction and which are connected to one another by side areas of the semiconductor layer sequence, which, in each case can be parallel to the growth direction. The laser light source described here can therefore comprise, in particular, a semiconductor layer sequence whose radiation coupling-out area is formed by a side area and which can thus be embodied as a so-called edge emitting semiconductor laser.

In this case, the semiconductor layer sequence can be based, for example, on the basis of a III-V compound semiconductor material system, in particular on one or more of the materials InGaAlN, InGaAlP or AlGaAs, wherein the semiconductor layer sequence comprises a layer sequence composed of different individual layers, which can comprise in each case one or more of the aforementioned material systems. Alternatively or additionally, the semiconductor layer sequence can also comprise a II-VI compound semiconductor material system. With material systems of this type it is possible to produce semiconductor layer sequences which emit electromagnetic radiation in an ultraviolet to infrared wavelength range and, for example for projection applications, preferably in a visible wavelength range.

The substrate of the semiconductor layer sequence, on which the epitaxial layers are applied, can comprise a semiconductor material, for example one of the above-mentioned compound semiconductor material systems. In particular, the substrate can comprise sapphire, GaAs, GaP, GaN, InP, SiC, Si and/or Ge or can be composed of such a material.

The semiconductor layer sequence can comprise as active region, for example, a conventional pn junction, a double heterostructure, a single quantum well structure (SQW structure) or a multiple quantum well structure (MWQ structure). The semiconductor layer sequence can comprise in the active region further functional layers and functional regions, for instance undoped or p- or n-doped confinement, cladding or waveguide layers, barrier layers, planarization layers, buffer layers, protective layers, passivation layers and/or electrode layers and combinations thereof. Such structures concerning the active region are known to the person skilled in the art with regard to construction, function and structure and will therefore not be explained in greater detail at this juncture. Furthermore, additional layers, for instance buffer layers, barrier layers and/or protective or passivation layers, can also be applied perpendicularly to the growth direction of the semiconductor layer sequence for example on the side areas of the semiconductor layer sequence. In particular, one or more passivation layers can be applied for example on the radiation coupling-out area.

In order to make it possible to operate the semiconductor layer sequence embodied as an edge emitting semiconductor laser diode in a transverse fundamental mode, layers of the semiconductor layer sequence which are arranged on at least one side of the active region can be structured for example in a ridge-shaped fashion and/or trapezoidally. Such configurations of the semiconductor layer sequence that are known as a ridge waveguide, ribbed waveguide, "ridge structure," "trapezoidal structure," or "tapered structure" are known to the person skilled in the art and will not be explained in further detail here. The radiation coupling-out area can comprise, in particular, a complete side area of the semiconductor layer sequence and can thus be formed by a side area of the substrate and also the side areas of the epitaxially deposited layers that are arranged thereabove.

Furthermore, the semiconductor layer sequence can comprise an optical resonator for the coherent electromagnetic radiation. The resonator can comprise, in particular, a first mirror on the radiation coupling-out area and a second minor on a rear side area of the semiconductor layer sequence situated opposite the radiation coupling-out area, the active region being arranged between said mirrors. Furthermore, the semiconductor layer sequence can also be embodied as a so-called "distributed feedback laser," DFB laser for short. The resonator structures mentioned here are known to the person skilled in the art and will therefore not be explained in further detail.

The resonator properties and the waveguide properties of the semiconductor layer sequence can result in a formation of the auxiliary emission region, which is vertically offset with respect to the main emission region and spatially separated therefrom. The auxiliary emission, that is to say the coherent electromagnetic radiation emitted from the auxiliary emission region of the radiation coupling-out area, can be at, in particular, an angle of greater than 0° with respect to the emission direction of the main emission, as a result of which one or more side peaks can form alongside the main peak of the main emission in the far-field beam profile.

In accordance with a further embodiment, the filter element is suitable for shading or absorbing the coherent electromagnetic radiation emitted from the main emission region near the semiconductor layer sequence or directly at the semiconductor layer sequence. For this purpose, the filter element can be embodied as a solid-angle covering, for example as a half-space covering, and for this purpose can have a suitable shape or else be arranged directly at the semiconductor layer sequence or in the vicinity thereof. As a result, the filter element can be suitable for shading the auxiliary emission directly at the emission point, that is to say directly at the auxiliary emission region, or near the auxiliary emission region, wherein the main emission, that is to say the coherent electromagnetic radiation emitted from the main emission region of the radiation coupling-out area, advantageously remains totally or at least almost uninfluenced and unrestricted. Disadvantageous changes in the far-field beam profile such as would be the consequence of using a stop at a larger distance from the radiation coupling-out area can thus advantageously be avoided.

In accordance with a further embodiment, the laser light source furthermore comprises a heat sink, on which the semiconductor layer sequence and the filter element are arranged. In particular, the semiconductor layer sequence can be arranged and mounted, for example soldered or adhesively bonded, with the substrate on the heat sink. As an alternative to the arrangement of the semiconductor layer sequence with the substrate on the heat sink, the semiconductor layer sequence can also be applied with the top side of the semiconductor layer sequence, facing away from the substrate, on the heat sink. With respect to the conventional growth order, in which firstly the n-conducting layers are deposited onto the substrate and then the p-conducting layers are finally deposited thereabove in a manner forming the top side, such an arrangement can also be designated as p-side-down.

The heat sink can comprise a metal and/or a ceramic material having a high thermal conductivity. By way of example, the heat sink can be composed of aluminum or copper, as a result of which electrical contact can also be made with the semiconductor layer sequence from the substrate via the heat sink. The filter element on the heat sink can be disposed downstream of the semiconductor layer sequence in particular in the emission direction of the electromagnetic radiation emitted from the main emission region. In particular, the filter element on the heat sink can cover a solid-angle range into which the auxiliary emission from the auxiliary emission region of the radiation coupling-out area is emitted. In this case, the filter element can directly adjoin the semiconductor layer sequence or else be arranged in a manner spatially separated, that is to say at a distance, from the semiconductor layer sequence on the heat sink.

Furthermore, the filter element can have a main extension plane that is parallel to the emission direction. That can mean, in particular, that the filter element is embodied in planar fashion and extends along the emission direction in a manner vertically offset with respect to the main emission region and with respect to the auxiliary emission region. By way of example, the filter element can comprise a part of the heat sink, in particular a part of the surface of the heat sink on which the semiconductor layer sequence is arranged. For this purpose, the heat sink can extend away from the semiconductor layer sequence in the emission direction as seen from the radiation coupling-out area of the semiconductor layer sequence and can thus have a part which is drawn in front of the semiconductor layer sequence, that is to say which is arranged in front of the semiconductor layer sequence. In this case, the heat sink can have an area having a front edge which is at a distance from the radiation coupling-out area of the semiconductor layer sequence, thus resulting in a surface region of the heat sink on which the coherent electromagnetic radiation emitted from the auxiliary emission region is incident. In this case, the filter element can be formed by said surface region.

Furthermore, the heat sink can have a step disposed downstream of the semiconductor layer sequence in the emission direction. In this case, the filter element can be arranged on a side area of the step which faces the semiconductor layer sequence and the radiation coupling-out area. The height of the step can be embodied in such a way that the main emission from the radiation coupling-out area is emitted in an undisturbed fashion or at least in a substantially uninfluenced fashion, while the auxiliary emission is shaded. In this case, the filter element can be formed by the side area of the step which faces the semiconductor layer sequence.

Furthermore, the filter element can comprise an absorber, a diode and a photodiode. In this case, the absorber, the diode and/or the photodiode can be arranged on that surface or that surface region of the heat sink on which the auxiliary emission is incident.

If the filter element comprises a diode or a photodiode, then the latter can simultaneously also be embodied as an ESD protective diode and be correspondingly interconnected with the semiconductor layer sequence. As a result, it can be possible that the laser light source does not require a further ESD protective diode, as a result of which a compact construction can advantageously arise.

If the filter element comprises a photodiode, then the coherent electromagnetic radiation emitted from the auxiliary emission region of the radiation coupling-out area can be utilized for measuring and monitoring the output power of the laser light source. Utilizing a photodiode as a filter element advantageously makes possible a synergistic effect as a result of additionally gaining the possibility of power monitoring while at the same time improving the vertical far-field beam profile.

The laser light source can furthermore be arranged on a carrier. The carrier can be embodied, for example, as a known housing for semiconductor laser diodes or as part thereof. By way of example, the carrier can be a so-called TO38, TO56 or TO90 housing or a part thereof. If the laser light source comprises a heat sink, the heat sink can be arranged on the carrier in such a way that heat which arises in the semiconductor layer sequence during operation can be dissipated to the carrier via the heat sink.

Furthermore, the filter element can additionally or alternatively comprise a first absorber for the coherent electromagnetic radiation generated by the semiconductor layer sequence directly on the radiation coupling-out area and/or a second absorber directly on a rear side area of the semiconductor layer sequence situated opposite the radiation coupling-out area. In this case, the first absorber and/or the second absorber can be arranged on coatings, for example facet and/or mirror coatings. The first absorber can be arranged, in particular, at least on the auxiliary emission region. The second absorber can be arranged at least on that region of the rear side area which is situated opposite the auxiliary emission region. By means of the first and/or second absorber, the auxiliary emission can be absorbed directly at the radiation coupling-out area and/or the rear side area.

Suitable materials for an absorber for the filter elements described here include, in particular, dielectric, semiconducting or metallic materials, for example one or more materials selected from the group silicon oxynitride, zirconium oxide, titanium oxide, tantalum pentoxide, tantalum dioxide, aluminum oxide, yttrium oxide, hafnium oxide, aluminum oxynitride, silicon, germanium, zinc telluride, gold, titanium, tantalum, niobium, copper, chromium, palladium, platinum, nickel and aluminum. With the use of a dielectric material, for example one of the oxides or oxynitrides mentioned, the absorber can be partially deposited with an oxygen deficiency in order to increase or control the absorbent effect. A subsequent heat treatment in an oxygen atmosphere can be used to reduce or adapt the absorption again. This adaptation is possible by means of a control of the oxygen content and of the heat treatment conditions. If the absorber comprises a metal applied directly on the radiation coupling-out area or the rear side area, then the semiconductor layer sequence can advantageously comprise a dielectric coating for example a facet or mirror coating on the corresponding side area as radiation coupling-out area or as rear side area between the semiconductor layer sequence and the absorber. Particularly preferably, the absorber comprises a non-saturable material.

Furthermore, the first and/or the second absorber can be applied on the radiation coupling-out area or the rear side area by means of a so-called self-aligning method. That can mean, in particular, that the electromagnetic radiation emitted from the main emission region can lead to a self-aligning reduction of the absorption effect of the first absorber in the main emission region and/or of the second absorber in a region situated opposite the main emission region. For this purpose, it is possible to apply to the entire radiation coupling-out area and/or rear side area a suitable material, for example a polymer layer, a carbon-containing layer, an absorbent oxide layer and/or a thin metal layer, which, upon activation of the semiconductor layer sequence, in the region of the main emission region or of the region of the rear side area situated opposite the main emission region, is totally or partly burned away or altered in terms of absorptivity by the coherent electromagnetic radiation. This can be done in a controlled atmosphere, for example an oxygen or ozone atmosphere. In this case, the material of the absorber and the thickness thereof are chosen in such a way that the intensity of the auxiliary emission does not suffice to burn away the absorber layer or to alter it in terms of its absorptivity, such that the first and/or second absorber form(s) a type of self-aligning stop.

The abovementioned filter elements have the advantage that it is not necessary to intervene in the process for producing the semiconductor layer sequence itself, thus giving rise to risk minimization by virtue of a high process reliability.

In accordance with a further embodiment, the filter element can comprise at least one absorber layer between the main emission region and the substrate, said at least one absorber layer comprising a semiconducting material that absorbs the coherent electromagnetic radiation. In this case, the absorber layer can be applied during the epitaxial growth of the semiconductor layer sequence before the active region on the substrate. As a result, it is possible to suppress the wave guiding and the propagation of the coherent electromagnetic radiation within the semiconductor layer sequence outside the active region and, in particular, in the region of the auxiliary emission region in such a way that electromagnetic radiation is not or substantially not emitted from the auxiliary emission region any more. Furthermore, the filter element can comprise a plurality of absorber layers, which can furthermore particularly preferably be arranged at a distance of $\lambda/4$ from one another, wherein $\lambda$ denotes an average wavelength of the electromagnetic radiation emitted by the laser light source.

In the case of a nitride-based semiconductor layer sequence, the absorber layer can comprise a thin InGaN layer, for example, which has a high defect density, as a result of which it is possible to achieve a suppression of the auxiliary emission by utilizing the defect absorption in the absorber layer. The defect-rich zones within the absorber layer or the high defect density can be produced by heat treatment, for example. Furthermore, the absorber layer can also have InGaN inhomogeneities, such that band edge absorption can take place in In-rich regions.

Furthermore, a reflective layer can be arranged between the at least one absorber layer and the substrate. The reflective layer, which can comprise, for example, a semiconducting or a metallic material and can also be embodied as a layer sequence, can advantageously reflect the coherent electromagnetic radiation passing through the absorber layer in the first pass, such that said radiation has to pass through the absorber layer a second time, as a result of which greater suppression and absorption can advantageously be possible.

In accordance with a further embodiment, the filter element comprises at least one cutout in an underside of the substrate situated opposite the active region. In this case, the cutout can extend from the underside of the substrate in the direction of the active region into the substrate. In particular, the at least one cutout can extend into the substrate to an extent such that it overlaps the auxiliary emission region in a vertical direction, and so the at least one cutout can project into the region in the substrate in which the waveguiding for the coherent electromagnetic radiation emitted from the auxiliary emission region is effected within the substrate. Such a structuring of the substrate underside makes it possible to reduce or even prevent the auxiliary emission.

The at least one cutout can comprise a depression, a drilled hole, a trench, an opening and/or a blind hole. In this case, the at least one cutout can be produced, for example, by sawing, drilling, photopatterning, dry etching, wet etching or a combination thereof. The at least one cutout can be at a distance in each case from the radiation coupling-out area and/or from the rear side area of the substrate situated opposite the radiation coupling-out area. This can mean, in particular, that the at least one cutout does not extend through the entire substrate along the emission direction.

Furthermore, the at least one cutout can also comprise a plurality of cutouts. The latter can be arranged alongside one another for example in the emission direction and/or in a lateral direction, that is to say perpendicularly to the emission direction. In this case, the at least one cutout can comprise one or more blind holes and/or straight or bent channels along and/or transversely with respect to the emission direction. The plurality of cutouts can be arranged periodically or else non-periodically, that is to say irregularly, along the emission direction and/or transversely with respect to the emission direction.

Furthermore, the at least one cutout can also be part of a roughening of the substrate underside. In this case, the roughness of the roughening can be embodied in such a way that the at least one cutout and thus the roughening extends into the part of the substrate in which the electromagnetic radiation emitted from the auxiliary emission region can propagate. The roughening can be produced by means of sawing and/or etching, for example, or can additionally or alternatively be engraved using a laser.

Furthermore, the at least one cutout can also extend from the radiation coupling-out area to the rear side area of the substrate situated opposite the radiation coupling-out area. This can mean, in particular, that the at least one cutout is embodied as a longitudinal channel extending completely through the substrate in the emission direction. Furthermore, such a depression extending completely through the substrate in the emission direction can also extend completely through the substrate in a lateral direction, that is to say transversely with respect to the emission direction. That can also mean that the filter element is produced by being completely or at least partly removed from the underside. As a result, the part of the substrate in which the coherent electromagnetic radiation emitted from the auxiliary emission region of the radiation coupling-out area is guided within the substrate can also be removed, such that an auxiliary emission region in the above sense is no longer present.

Furthermore, the at least one cutout can be at least partly filled with a material that absorbs the coherent electromagnetic radiation and/or a thermally conductive material. It is thereby possible to achieve a better suppression of the coherent electromagnetic radiation emitted from the auxiliary emission region and/or an improved thermal linking to a heat sink, for example. Suitable materials for the absorbent material and/or the thermally conductive material include the materials mentioned above in connection with the first and second absorbers.

In accordance with a further embodiment, the cutout comprises a bevel of the substrate at the radiation coupling-out area. In this case, at least one part of the bevel comprises the auxiliary emission region, whereas the bevel does not extend as far as the main emission region. What can thereby advantageously be achieved is that the auxiliary emission is diverted from the emission direction of the main emission and, consequently, is no longer present in the perceived far-field.

BRIEF DESCRIPTION OF THE DRAWINGS

Further advantages and advantageous embodiments and developments of the invention will become apparent from the embodiments described below in conjunction with FIGS. 1A to 12B.

FIGS. 2A to 2C show schematic illustrations of laser light sources in accordance with some exemplary embodiments;

FIGS. 3 to 11C show schematic illustrations of laser light sources in accordance with further exemplary embodiments.

DETAILED DESCRIPTION OF ILLUSTRATIVE EMBODIMENTS

In the exemplary embodiments and figures, identical or identically acting constituent parts may in each case be provided with the same reference signs. The elements illustrated and their size relationships among one another should not be regarded as true to scale, in principle; rather, individual elements, e.g., layers, devices, components and regions, may be illustrated with exaggerated thickness or size dimensions in order to enable better illustration and/or in order to afford a better understanding.

FIG. 1 shows a semiconductor layer sequence 1 for generating coherent electromagnetic radiation. Purely by way of example, a semiconductor layer sequence 1 based on a nitride semiconductor composite system is shown in this case. As an alternative thereto, the semiconductor layer sequence can also comprise or consist of other material systems described in the general part.

The semiconductor layer sequence 1 comprises an approximately 110 μm thick n-doped GaN substrate 2, on which an active region 3 is deposited epitaxially. The active region 3 comprises a plurality of individual layers, which are not shown for the sake of clarity. The active region 3 comprises, in particular, an active layer between n-type and p-type cladding and waveguide layers, which, in the exemplary embodiment shown, are based on a GaN compound semiconductor material system and have properties and compositions as described in the general part. The active region 3 is structured as a ridge waveguide, over the side flanks of which a passivation layer 7, for example comprising SiOx, AlOx and/or SiNi is deposited.

Figure 1A:
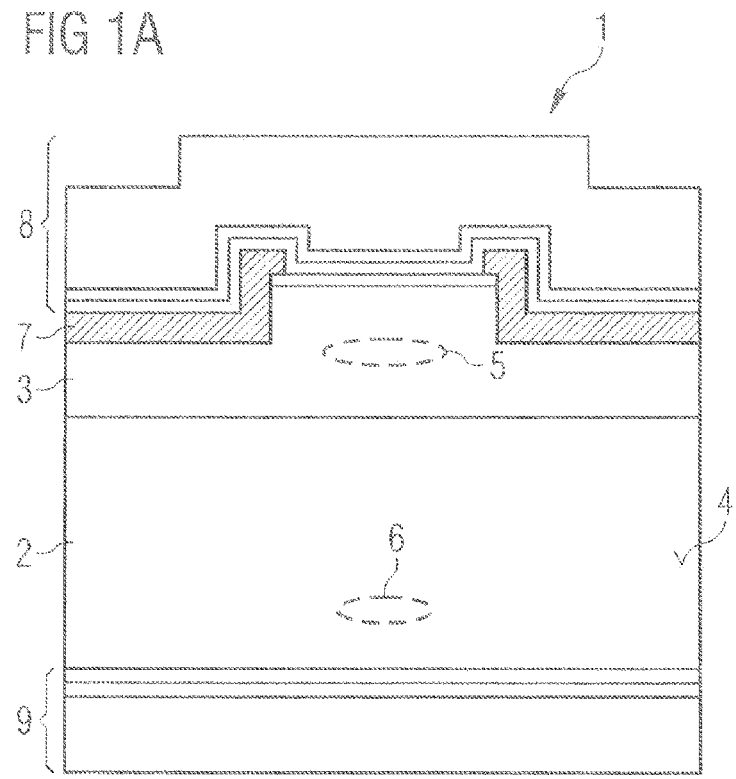
FIGS. 1A and 1B show a schematic illustration of a semiconductor layer sequence for emitting coherent electromagnetic radiation and a far-field beam profile.

For the purpose of making electrical contact, the semiconductor layer sequence 1 comprises, on the passivation layer 7 and the active region 3, a contact layer stack 8 comprising a plurality of layers, which can comprise, for example, nickel, platinum, palladium, titanium and/or gold while a further electrical contact layer sequence 9 comprising a plurality of metallic layers is applied on the substrate underside facing away from the active region 3. The construction of the semiconductor layer sequence embodied as an edge emitting semiconductor laser having a ridge waveguide structure, as shown in FIG. 1A, and modifications thereof are known to the person skilled in the art and will therefore not be explained in further detail here. In particular, the following exemplary embodiments are not restricted to the semiconductor layer sequence 1 shown in FIG. 1A.

The semiconductor layer sequence in FIG. 1A is illustrated in a front illustration with a view of the radiation coupling-out area 4. The latter, like for example also a rear side area of the semiconductor layer sequence 1 situated opposite the radiation coupling-out area 4, can comprise one or more mirror and/or passivation layers (not shown). In the active region 3, a main emission region 5 is indicated by means of a dashed line, coherent electromagnetic radiation being emitted in said main emission region during operation with an emission direction which, in the illustration shown, projects perpendicularly to the plane of the drawing out of the latter. The radiation coupling-out area 4 is thus formed by a side area of the semiconductor layer sequence 1 which comprises a side area of the active region 3 and a side area of the substrate 2. An auxiliary emission region 6 is indicated on the side area of the substrate 2 by means of a dashed line, said auxiliary emission region being vertically offset with respect to the main emission region 5 and spatially separated from the latter. In the exemplary embodiment shown, the auxiliary emission region 6 is at a distance of approximately 80 micrometers from the main emission region 5 in a vertical direction, that is to say in a direction along the growth direction of the active region 3. The coherent electromagnetic radiation emitted from the auxiliary emission region 6 results from an additional mode in the semiconductor layer sequence 1 which is guided in the substrate 2. Depending on the composition of the materials of the active region 3, the semiconductor layer sequence 1 can be embodied as a green, blue or ultraviolet laser diode, for example.

Figure 1B:
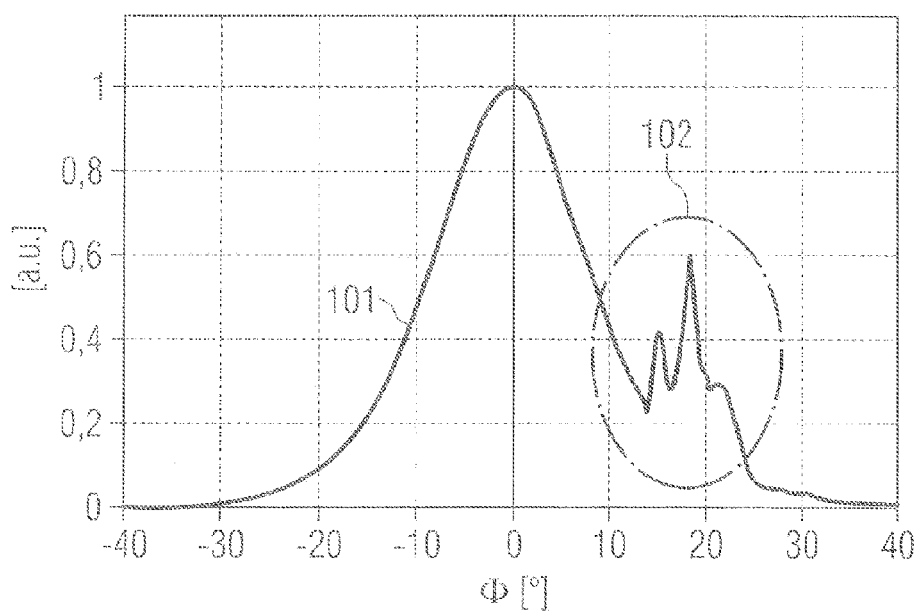

FIG. 1B shows a vertical far-field beam profile 101 of the coherent electromagnetic radiation emitted by the semiconductor layer sequence in FIG. 1A. In this case, the emission angle in degrees relative to the emission direction is shown on the horizontal X-axis. The relative intensity of the emitted coherent electromagnetic radiation in arbitrary units is applied on the vertical Y-axis. A maximum corresponding to the maximally emitted intensity of coherent electromagnetic radiation from the main emission region 5 is discernible at 0°, that is to say along the emission direction. In addition, from a direction inclined approximately 20° relative to the emission direction of the main emission, a side peak 102 is discernible, which is brought about by coherent electromagnetic radiation emitted from the auxiliary emission region 6. In this case, the auxiliary emission has a lower intensity than the main emission along the emission direction.

The following figures show the semiconductor layer sequence 1 in each case in a schematic illustration corresponding to a vertical section through the semiconductor layer sequence 1 in FIG. 1A through the main emission region 5 and the auxiliary emission region 6. For the sake of clarity, the following figures show only the substrate 2 and the active region 3 of the semiconductor layer sequence 1, whereas the main emission region 5, the auxiliary emission region 6, the electrical contact layer sequences 8, 9 and electrical connection possibilities such as, for instance, bonding wires and/or soldering means are not shown.

The laser light source in accordance with the exemplary embodiment in FIG. 2A comprises a heat sink 14 in addition to the semiconductor layer sequence 1, on which heat sink the semiconductor layer sequence 1 is soldered by the substrate underside situated opposite the active region 3. The heat sink 14 comprises a material having a high thermal conductivity, such that the heat arising in the semiconductor layer sequence 1 during operation can be efficiently dissipated. Together with the heat sink 14, the semiconductor layer sequence 1 is applied on a carrier 15, which can be a part of a housing, for example, in particular for example of a conventional laser diode package such as a TO38 package, for instance.

Furthermore, the radiation coupling-out area 4 and the coherent electromagnetic radiation 10 emitted from the main emission region 5 are shown, said radiation being emitted along the emission direction 11 in an emission cone that results in the vertical far-field beam profile shown in FIG. 1 being without the side peak 102. Furthermore, the coherent radiation emitted from the auxiliary emission region 6 of the radiation coupling-out area 4 is also shown, which radiation, with regard to its emission direction, forms an angle 91 with the emission direction 11 of the main emission 10, wherein the angle 91 corresponds to the angle φ shown in FIG. 1B. As is shown in FIG. 1B, the auxiliary emission 12 is emitted at an angle of approximately 20 degrees with respect to the emission direction 11 of the main emission 10. In this case, the angle 91 should be understood to be purely by way of example and should not be considered to be restrictive for the exemplary embodiment shown here and the following exemplary embodiments. Rather, the semiconductor layer sequences 1 of the laser light sources shown here can also emit coherent electromagnetic radiation 12 from the auxiliary emission region 6 at other angles relative to the emission direction 11.

The laser light source in accordance with the exemplary embodiment in FIG. 2A furthermore comprises a filter element 13, which is embodied as part of that surface of the heat sink 14 which faces the semiconductor layer sequence 1. In this case, the surface region 131 of the heat sink 14 which is embodied as a filter element 13 has a length 90 chosen in such a way that the coherent electromagnetic radiation 12 emitted from the auxiliary emission region 6 impinges on the filter element 13. The auxiliary emission 12 can be effectively shaded as a result. The required minimum distance of that edge of the heat sink 14 which is disposed downstream of the radiation coupling-out area 4 in the emission direction 11, that is to say the required minimum dimension of the length 90, is dependent on the distance between the auxiliary emission region 6 and the underside of the semiconductor layer sequence 1 situated opposite the active region 3 and the angle 91 between the emission direction of the auxiliary emission 12 and the emission direction 11 of the main emission 10. If the height of the auxiliary emission region 6 above the semiconductor layer sequence underside is designated by h, the angle 91 by φ and the length 90 by a, then the following results as the minimum dimension for the length 90 or a:

$$a > h/\tan\phi$$

For typical angles 91 or φ and typical semiconductor layer sequences 1, values of between approximately 27 micrometers and approximately 165 micrometers result for the length 90 or a. A length 90 or a of approximately 150 micrometers has proved to be particularly suitable. In this case, the length 90 or a is still small enough not to restrict the emission cone of the main emission 10, or to restrict it only insignificantly.

Figure 12A:
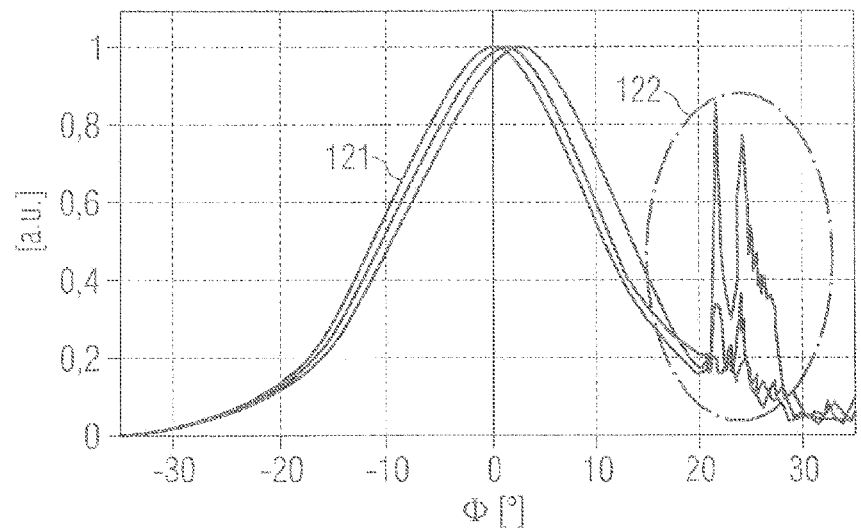
FIGS. 12A and 12B show far-field beam profiles of laser light sources.
Figure 12B:
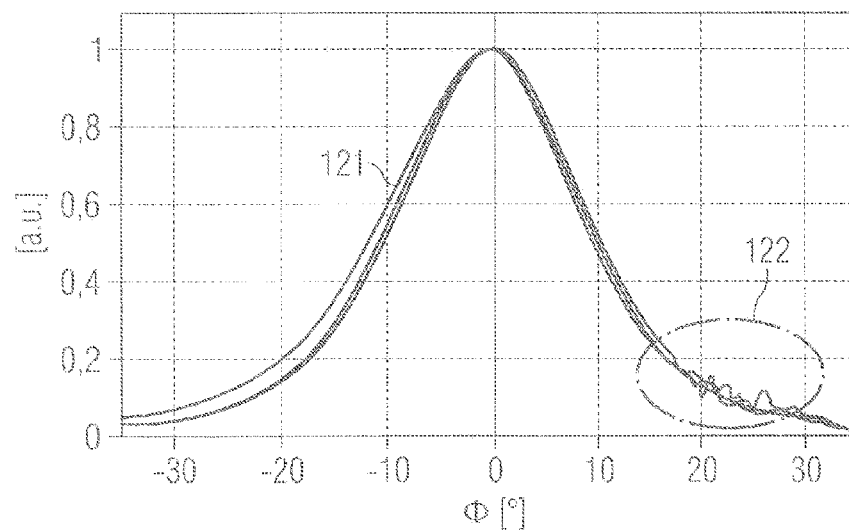

FIGS. 12A and 12B in each case show a plurality of vertical far-field beam profiles 121 of the coherent electromagnetic radiation emitted by laser light sources, wherein laser light sources comprising conventional heat sinks which projects only approximately 20 μm beyond the radiation coupling-out area 4 in the emission direction were used in FIG. 12A while heat sinks in accordance with the exemplary embodiment in FIG. 2A having a length 90 of approximately 150 μm was used for the measurements in FIG. 12B. Comparison of FIGS. 12A and 12B readily reveals that in the angular range 122 between approximately 20° and approximately 30°, by means of the filter element 13 formed by the surface region 131 of the heat sink 14, the auxiliary emission 12 is shaded very effectively and no reflections thereof are discernible either. Vertical far-field beam profiles as shown in FIG. 12B are suitable, in comparison with the far-field beam profiles 121 in accordance with FIG. 12A, for projection applications, for example, since the coherent electromagnetic radiation emitted by the laser light sources in each case exhibits a Gaussian beam profile without auxiliary peaks.

As is shown in FIG. 2A, the filter element 13 has a main extension plane that is parallel to the emission direction 11 of the main emission 10.

In order to suppress possible reflections at the surface region 131 of the heat sink 14 which is embodied as a filter element 13, in accordance with the exemplary embodiment in FIG. 2B, an absorber 132 can be additionally applied on the heat sink 14, said absorber extending in planar fashion and parallel to the emission direction 11 away from the radiation coupling-out area 4. In this case, the absorber 132 can comprise one of the materials mentioned in the general part which are suitable for absorbing the coherent electromagnetic radiation 12 generated by the semiconductor layer sequence 1.

In accordance with the exemplary embodiment in FIG. 2C, as a filter element on the heat sink it is also possible to apply a diode or, as shown, a photodiode 133 as a filter element. As a result, the coherent electromagnetic radiation 12 emitted from the auxiliary emission region 6 can be utilized for measuring the output power of the semiconductor layer sequence 1 and thus of the laser light source. The photodiode 133 can furthermore also be interconnected as an ESD diode with the semiconductor layer sequence 1. As an alternative thereto, instead of the photodiode 133, it is also possible to utilize an ESD protective diode without a monitoring function as filter element 13. The correct height of the photodiode 133 can be adapted by means of a step in the heat sink 114 (not shown), such that the coherent electromagnetic radiation 10 emitted from the main emission region 5 is not shaded.

In accordance with the exemplary embodiment in FIG. 3, the heat sink 14 has a step 141, which has a side area which faces the semiconductor layer sequence 1 and on which an absorber 132 embodied as a filter element 13 is applied. In this case, the height of the step is adapted in such a way that the coherent electromagnetic radiation 10 emitted from the main emission region 5 is not shaded or is shaded only insignificantly. As an alternative to the exemplary embodiment shown, that side area of the step 141 which faces the semiconductor layer sequence 1 can also form the filter element, without an absorber 132 being arranged thereon.

FIG. 4A shows a further exemplary embodiment of a laser light source, wherein the filter element 13 is embodied as an absorber 132 arranged directly on the radiation coupling-out area 4. In this case, the absorber 132 can comprise one of the materials mentioned above in the general part. If an electrically conductive material such as a metal, for instance is used as absorber material, then a risk of short circuit of the semiconductor layer sequence 1 can be precluded by the radiation coupling-out area 4 being passivated and thus electrically insulated by means of one or more passivation layers. If a dielectric such as, for instance, one of the oxides or oxynitrides mentioned in the general part is applied as absorber material, then the absorber 132 can be deposited partially with oxygen deficiency in order to increase or in order to control the absorbent effect of the filter element 13. The absorption can be reduced further by means of subsequent heat treatment in an $O_2$ atmosphere, such that the absorptance of the absorber 132 can be set by way of the oxygen content and the heat treatment conditions. In the exemplary embodiment shown, the absorber 132 is applied on the radiation coupling-out area 4 of the semiconductor layer sequence 1 in such a way that only the auxiliary emission region 6 is covered, whereas the main emission region 5 remains free.

As is shown in the exemplary embodiment in FIG. 4B, in addition to a first absorber 132 on the radiation coupling-out area 4, a second absorber 134 can be applied on the rear side area 16 situated opposite the radiation coupling-out area 4. As an alternative thereto, it is also possible for an absorber 134 as filter element 13 to be applied only on the rear side area 16. For the second absorber 134, the statements made above for the first absorber 132 are likewise applicable.

FIGS. 5A and 5B show a method wherein an absorber layer 132 is applied on the radiation coupling-out area 4 in such a way that the absorber 132 completely covers the radiation coupling-out area 4. In this case, the absorber 132 can comprise a polymer layer, a carbon-containing layer, an absorbent oxide layer and/or a thin metal layer, the thickness of which is so small that the absorber 132, upon activation of the semiconductor layer sequence 1, is at least partly or else completely burned away or altered in terms of absorptivity by the coherent electromagnetic radiation 10 emitted from the main emission region 5 in such a way that the main emission 12 can be emitted by the laser light source. The thickness of the absorber 132 is furthermore adapted in such a way that the intensity of the coherent electromagnetic radiation 10 emitted from the auxiliary emission region 6 does not suffice to burn away the absorber 132. It is thereby possible to produce a filter element 13 in the form of a self-aligning stop on the radiation coupling-out area 4. The burning-away or bleaching-out of the absorber 132 can take place in a controlled atmosphere, for example an $O_2$ or an $O_3$ atmosphere.

FIGS. 6A and 6B show a similar method, wherein, in comparison with FIGS. 5A and 5B, in addition to the first absorber 132 on the radiation coupling-out area 4, a second absorber 134 is applied on the rear side area 16 of the semiconductor layer sequence 1 situated opposite the radiation coupling-out area 4. Depending on the configuration of the rear side area 16 of the semiconductor layer sequence 1, upon activation of the semiconductor layer sequence 1, the second absorber 134 can also be burned away in a region situated opposite the main emission region 5 of the radiation coupling-out area 4 on the rear side area 16.

The exemplary embodiment in FIGS. 7A and 7B shows a sectional illustration of a laser light source and respectively a front view of the radiation coupling-out area 4 of an associated semiconductor layer sequence 1, wherein the filter element 13 in this exemplary embodiment is embodied as an absorbent semiconducting material 135 arranged between the main emission region 5 and the substrate 2. For this purpose, during the epitaxial growth of the active region 3, a thin layer composed of the absorbent semiconducting material 135 can be applied on the substrate 2. If the semiconductor layer sequence 1, for example as shown in FIG. 1A, comprises a nitride-based compound semiconductor material system, the absorber layer comprising the absorbent semiconducting material 135 can be embodied, for example, as an InGaN layer having defect-rich zones, which can be produced by heat treatment, for example, or as an InGaN layer having InGaN inhomogeneities, which can be produced by corresponding growth conditions. As an alternative thereto, the absorber layer comprising the absorbent semiconducting material 135 can also comprise a plurality of layers composed of absorbent semiconducting materials.

The absorbent semiconducting material 135 can prevent or at least reduce a propagation of coherent electromagnetic radiation into the substrate 2, such that no or a weaker-intensity coherent electromagnetic radiation 12 can be emitted in the auxiliary emission region 6.

Additionally, on that side of the absorber layer 135 which faces away from the active region 3, it is possible to arrange one or more reflective layers or a reflective layer sequence by which coherent electromagnetic radiation that can penetrate through the absorber layer 135 in a first pass is reflected back again to the absorber layer 135 and can be absorbed there in a second pass.

Figure 8A:
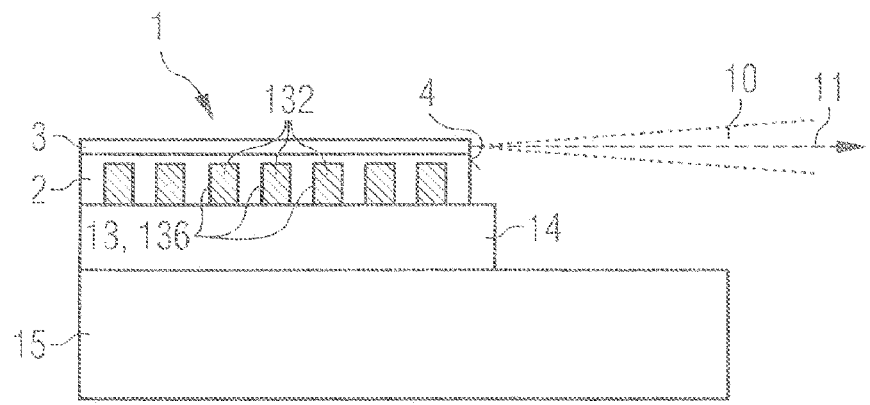
Figure 8B:
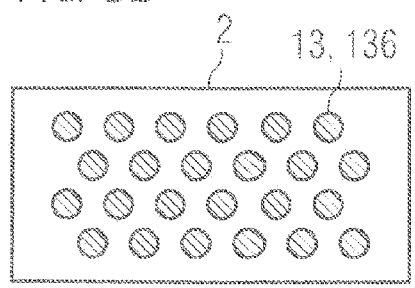
Figure 8C:
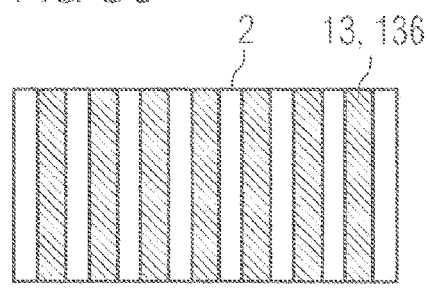
Figure 8D:
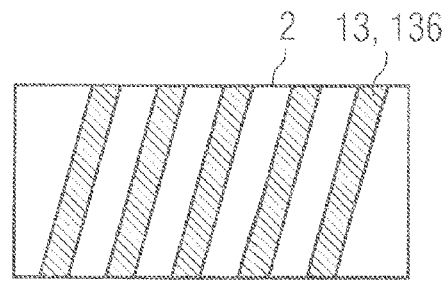
Figure 8E:
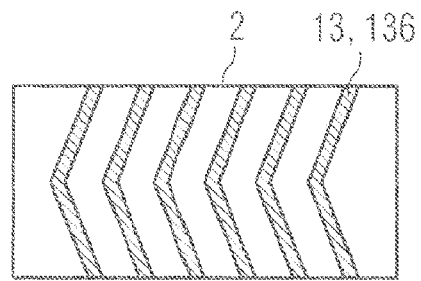
Figure 9A:
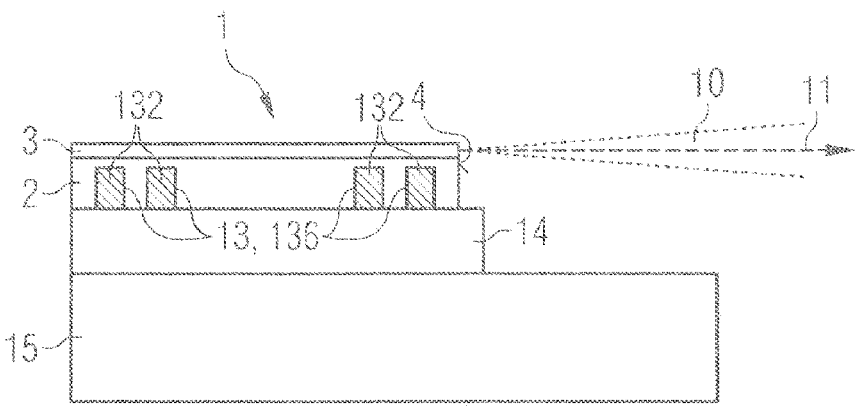
Figure 9B:
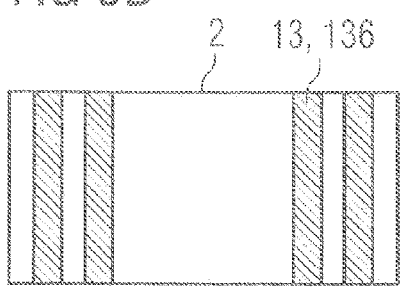
Figure 9C:
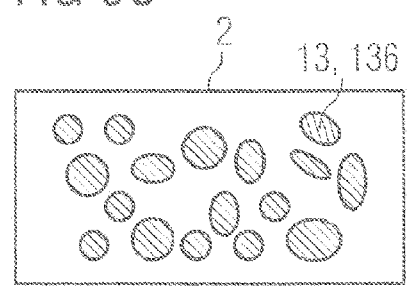
Figure 9D:
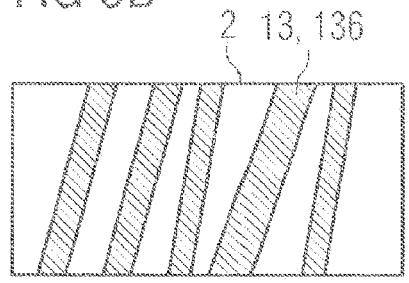

FIG. 8A shows a further exemplary embodiment of a laser light source, wherein the filter element 13 comprises at least one cutout 136 in the substrate 2, said at least one cutout being arranged in the underside of the substrate 2 situated opposite the active region 3. As is shown in the exemplary embodiment in FIG. 8A, the filter element 13 can also comprise a plurality of such cutouts 136 in the substrate 2. In this case, as is shown in FIGS. 8B to 8E, the one or the plurality of cutouts 136 can be embodied as drilled holes in the form of channels perpendicular to the main extension direction of the semiconductor layer sequence, that is to say in a vertical direction, (FIG. 8B), or can be arranged as channels in the main extension plane of the semiconductor layer sequence 1 and thus perpendicular to the vertical direction in straight, oblique or bent fashion (FIGS. 8C, 8D and 8E). In this case, the one or the plurality of cutouts 136 can be free of material (not shown) or, as shown in the present case, can be at least partly or completely filled with an absorber material 132. One of the materials mentioned above is suitable as absorber material. Alternatively or additionally, the cutouts 136 can also be at least partly or completely filled with a material having a good thermal conductivity. Gold deposited electrolytically is particularly advantageous here which have both a good thermal conduction and a high absorption.

In this case, the one cutout 136 or the plurality of cutouts 136 project(s) into the substrate 2 from the underside to an extent such that they overlap the auxiliary emission region 6 in a vertical direction, such that it is possible to suppress or even prevent a propagation of coherent electromagnetic radiation in the substrate 2 in this region.

The cutouts 136 can be produced, for example, by sawing, by a phototechnology and dry etching or wet etching or other known patterning methods. As is shown in FIGS. 8A to 8E, the cutouts 136 can in this case be distributed periodically and regularly in the substrate. As an alternative thereto, as is shown in FIGS. 9A to 9D, the plurality of cutouts 136 which form the filter element 13 can be distributed in the substrate in such a way that no periodic structure is formed. Otherwise, the statements made with regard to FIGS. 8A to 8E are applicable to the exemplary embodiments shown in FIGS. 9A to 9D.

As an alternative or in addition to the cutouts 136 shown in FIGS. 8A to 9D, the filter element 13 can also have at least one cutout which extends from the radiation coupling-out area along the emission direction 11 as far as the rear side area situated opposite the radiation coupling-out area 4.

The exemplary embodiment in FIG. 10 shows a laser light source comprising a semiconductor layer sequence 1 wherein the cutout 136 extends over the entire main extension plane of the substrate 2, such that the thickness of the substrate 2 is reduced in such a way that the auxiliary emission region 6 is removed. Besides such partial removal of the substrate 2, the substrate 2 can also be removed completely or down to a minimum residual thickness of a few micrometers.

FIGS. 11A to 11C show further exemplary embodiments of laser light sources, wherein the filter element 13 is embodied as a cutout in the substrate 2, wherein the cutout is in each case embodied as a bevel 137 in the radiation coupling-out area 4. In this case, the auxiliary emission region 6 is formed by at least one part of the bevel 137, thereby achieving the effect that the coherent electromagnetic radiation 12 emitted from the auxiliary emission region 6 is diverted further from the emission direction of the main emission 10 along the emission direction 11 and thus is no longer present in the far-field. In this case, as shown in FIG. 11A, a surface region 131 of the heat sink 14 or else an additional absorber or a diode or photodiode as in the exemplary embodiments in accordance with FIGS. 2A to 2C can form an additional part of the filter element 13. As is shown in FIGS. 11B and 11C, the semiconductor layer sequence 1 can also extend over the heat sink 14 and the carrier 15.

As an alternative to the mounting of the semiconductor layer sequence 1 with the substrate 2 on the heat sink 14 as shown in the exemplary embodiments, the semiconductor layer sequence 1 can also be applied on the heat sink 14 with the substrate 2 facing away from the heat sink 14. If the semiconductor layer sequence has a typical growth order in which firstly the n-conducting layers are grown on the substrate 2 and then the p-conducting layers of the active region 3 are grown, then in this case this is also referred to as so-called p-side-down mounting, while p-side-up mounting is shown purely by way of example in the figures.

The filter elements described in the exemplary embodiments shown and in the general part can also be combined with one another, such that a laser light source according to the present application can also comprise a combination of the filter elements described and shown.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A laser light source for emitting coherent electromagnetic radiation having a vertical far-field beam profile, the laser light source comprising:
   a semiconductor layer sequence with an active region on a substrate, the semiconductor layer sequence configured to generate the coherent electromagnetic radiation, wherein the coherent electromagnetic radiation is emitted during operation at least from a main emission region of a radiation coupling-out area with an emission direction and the radiation coupling-out area is formed by a side area of the semiconductor layer sequence;
   a filter element configured to suppress coherent electromagnetic radiation in the vertical far-field beam profile, the radiation being generated during operation and emitted from an auxiliary emission region of the radiation coupling-out area, the auxiliary emission region being vertically offset and spatially separated with respect to the main emission region; and
   a heat sink, wherein the semiconductor layer sequence and the filter element are in each case arranged on the heat sink.

2. The laser light source according to claim 1, wherein the filter element extends away from the radiation coupling-out area in a manner vertically offset with respect to the main emission region and with respect to the auxiliary emission region.

3. The laser light source according to claim 2, wherein the filter element has a main extension plane that is parallel to the emission direction.

4. The laser light source according to claim 1, wherein the heat sink has a step and the filter element is arranged on a side area of the step that faces the semiconductor layer sequence.

5. The laser light source according to claim 1, wherein the filter element comprises an absorber, a diode and/or a photodiode.

6. The laser light source according to claim 1, wherein the filter element comprises a cutout in an underside of the substrate, the underside situated opposite the active region.

7. The laser light source according to claim 6, wherein the cutout is at a distance from the radiation coupling-out area and/or a rear side area of the substrate situated opposite the radiation coupling-out area.

8. The laser light source according to claim 6, wherein the filter elements comprises a plurality of cutouts arranged successively in the emission direction, the cutout being one of the plurality of cutouts.

9. The laser light source according to claim 6, wherein the cutout extends from the radiation coupling-out area to a rear side area of the substrate situated opposite the radiation coupling-out area.

10. The laser light source according to claim 6, wherein the cutout is at least partly filled with a material that absorbs the coherent electromagnetic radiation and/or a thermally conductive material.

11. The laser light source according to claim 6, wherein the cutout comprises a bevel of the substrate at the radiation coupling-out area and the auxiliary emission region is formed by at least one part of the bevel.

12. The laser light source according to claim 1, wherein the filter element comprises an absorber layer between the main emission region and the substrate, the absorber layer comprising a semiconducting material that absorbs the coherent electromagnetic radiation.

13. The laser light source according to claim 1, wherein the filter element comprises a first absorber for the coherent electromagnetic radiation generated by the semiconductor layer sequence directly on the radiation coupling-out area and/or a second absorber directly on a rear side area of the semiconductor layer sequence situated opposite the radiation coupling-out area.

14. A laser light source for emitting coherent electromagnetic radiation having a vertical far-field beam profile, the laser light source comprising:
   a semiconductor layer sequence with an active region on a substrate, the semiconductor layer sequence configured to generate the coherent electromagnetic radiation, wherein the coherent electromagnetic radiation is emitted during operation at least from a main emission region of a radiation coupling-out area with an emission direction and the radiation coupling-out area is formed by a side area of the semiconductor layer sequence; and
   a filter element configured to suppress coherent electromagnetic radiation in the vertical far-field beam profile, the radiation being generated during operation and emitted from an auxiliary emission region of the radiation coupling-out area, the auxiliary emission region being vertically offset and spatially separated with respect to the main emission region, wherein the filter element comprises a cutout in an underside of the substrate, the underside situated opposite the active region.

15. A laser light source for emitting coherent electromagnetic radiation having a vertical far-field beam profile, the laser light source comprising:
   a semiconductor layer sequence with an active region on a substrate, the semiconductor layer sequence configured to generate the coherent electromagnetic radiation, wherein the coherent electromagnetic radiation is emitted during operation at least from a main emission region of a radiation coupling-out area with an emission direction and the radiation coupling-out area is formed by a side area of the semiconductor layer sequence; and
   a filter element configured to suppress coherent electromagnetic radiation in the vertical far-field beam profile, the radiation being generated during operation and emitted from an auxiliary emission region of the radiation coupling-out area, the auxiliary emission region being vertically offset and spatially separated with respect to the main emission region;

a heat sink, wherein the semiconductor layer sequence together with the substrate as well as the filter element are in each case arranged on the heat sink;

wherein the filter element is embodied as part of a surface of the heat sink that is arranged, in the emission direction, in front of the radiation coupling out area and that extends away from the radiation coupling-out area in a manner vertically offset with respect to the main emission region and with respect to the auxiliary emission region; and wherein the filter element has a main extension plane that is parallel to the emission direction.

16. A laser light source for emitting coherent electromagnetic radiation having a vertical far-field beam profile, the laser light source comprising:

a semiconductor layer sequence with an active region on a substrate, the semiconductor layer sequence configured to generate the coherent electromagnetic radiation, wherein the coherent electromagnetic radiation is emitted during operation at least from a main emission region of a radiation coupling-out area with an emission direction and the radiation coupling-out area is formed by a side area of the semiconductor layer sequence; and a filter element configured to suppress coherent electromagnetic radiation in the vertical far-field beam profile, the radiation being generated during operation and emitted from an auxiliary emission region of the radiation coupling-out area, the auxiliary emission region being vertically offset and spatially separated with respect to the main emission region, wherein the filter element comprises an absorber layer between the main emission region and the substrate, the absorber layer comprising a semiconducting material that absorbs the coherent electromagnetic radiation.

17. A laser light source for emitting coherent electromagnetic radiation having a vertical far-field beam profile, the laser light source comprising:

a semiconductor layer sequence with an active region on a substrate, the semiconductor layer sequence configured to generate the coherent electromagnetic radiation, wherein the coherent electromagnetic radiation is emitted during operation at least from a main emission region of a radiation coupling-out area with an emission direction and the radiation coupling-out area is formed by a side area of the semiconductor layer sequence; and a filter element configured to suppress coherent electromagnetic radiation in the vertical far-field beam profile, the radiation being generated during operation and emitted from an auxiliary emission region of the radiation coupling-out area, the auxiliary emission region being vertically offset and spatially separated with respect to the main emission region, wherein the filter element comprises a first absorber for the coherent electromagnetic radiation generated by the semiconductor layer sequence directly on the radiation coupling-out area and/or a second absorber directly on a rear side area of the semiconductor layer sequence situated opposite the radiation coupling-out area.

18. The laser light source according to claim 16, wherein a reflective layer is arranged between the absorber layer and the substrate.

19. The laser light source according to claim 17, wherein the electromagnetic radiation emitted from the main emission region leads to a self-aligning reduction of the absorption effect of the first absorber in the main emission region and/or of the second absorber in a region situated opposite the main emission region.

* * * * *